United States Patent [19]

Bellis et al.

[11] Patent Number: 4,491,782
[45] Date of Patent: Jan. 1, 1985

[54] APPARATUS FOR LOCATING FAULTS IN ELECTRIC CABLES

[76] Inventors: Edward J. Bellis, 14 Royston Close, Ellesmere Port, Cheshire; Philip F. Gale, Garden Cottage, Sacombe Green, Ware, Hertfordshire, both of England

[21] Appl. No.: 365,044

[22] Filed: Apr. 2, 1982

[30] Foreign Application Priority Data

Apr. 7, 1981 [GB] United Kingdom ............... 8110868

[51] Int. Cl.³ .................................... G01R 31/08
[52] U.S. Cl. ............................................ 324/52
[58] Field of Search ................ 324/52, 51; 340/825.16

[56] References Cited

U.S. PATENT DOCUMENTS 2,628,267  2/1953  Stringfield et al. ............... 324/52
3,244,975  4/1966  Bauer ................................ 324/52
3,781,665  12/1973  Gale .................................. 324/52
4,151,459  4/1979  Fayolle et al. ..................... 324/52

Primary Examiner—Stanley T. Krawczewicz
Attorney, Agent, or Firm—Buell, Ziesenheim, Beck & Alstadt

[57] ABSTRACT

Apparatus for detecting and locating a fault in an electric cable or cable installation using a pulse-echo or impulse current technique comprises a low voltage pulse generator for injecting a series of pulses into a cable or cable installation; a digital store and memory for recording a predetermined number of pulses and for digitizing and storing the waveforms obtained under two different conditions of the cable; means for terminating the recording of pulses a predetermined time after a fault condition is detected; and means for retrieving the signals obtained under the two separate conditions, comparing them and thus locating the position of the fault.

10 Claims, 5 Drawing Figures

APPARATUS FOR LOCATING FAULTS IN ELECTRIC CABLES

This invention relates to apparatus for locating faults in electric cables using pulse-echo or impulse current techniques, and is applicable more especially, but not exclusively, to fault detection apparatus for use in power distribution cable installations having a number of single or three-phase branches, especially those with difficult or impossible access to a termination or terminations, such as low voltage distribution systems.

One of the applicants here is the inventor and applicant in co-pending application Ser. No. 496,063, filed May 19, 1983 in the name of Philip Franklin Gale, which application is assigned to the same assignee as the present application.

Pulse-echo techniques have been used for some time for detecting faults in high voltage cables for example, as disclosed in our UK Pat. Application No. 2058507A. This known technique can more easily detect faults when the fault resistance is not greater than the cable impedance. If a breakdown occurs in a high voltage cable, a technique known as "fault-burning" can be used (in which an abnormally high voltage is applied to the cable) to accentuate the fault and reduce its resistance. Alternatively the impulse current method of fault location (as described in our UK Pat. Nos. 1508351 and 1508352) can be applied, whereby the fault is broken down for a short period of time using a high voltage impulse and the resulting transient waveforms are captured by a digital signal acquisition system. Neither fault burning nor the impulse current method can however, be used on low voltage cables due to the difficulty of disconnecting all the consumer's apparatus normally supplied by the faulty cable.

An object of the present invention is to provide improved apparatus that can be used with the consumer's apparatus still connected, since its use does not entail hazardous high voltages as the cable is only re-energised with the normal system voltage. A further object is to provide improved apparatus that will detect low voltage cable faults exhibiting a non-linear and unstable voltage: current characteristic where the fault current only flows during the times when the instantaneous voltage of the supply is greater than the arc voltage of the fault. The improved apparatus of this invention can be used for high and low voltage cables.

According to the invention the improved apparatus for detecting and locating a fault in an electric cable or cable installation using a pulse-echo technique or impulse current technique comprises a low voltage pulse generator for injecting a series of pulses into a cable or cable installation; a digital store and memory for recording a predetermined number of pulses and for digitising and storing the waveforms obtained under two different conditions of the cable; means for terminating the recording of pulses a predetermined time after a fault condition is detected; and means for retrieving the signals obtained under the two separate conditions, comparing them and thus locating the position of the fault.

The arrangement is such that the memory is instructed to stop recording when a fault condition is detected, the memory retaining recordings of a number of pulses before the fault is detected, and recordings of the pulses after the fault is detected, before the recording of the pulses is terminated. Signals obtained under normal and fault conditions are stored and, by retrieving and comparing them, the location of the fault is determined.

During the time when no fault is detected, the memory is continually refreshed with each new pulse replacing the recording of the earliest of the stored pulses.

Preferably, the improved apparatus also comprises means for recording a power frequency waveform (usually 50 or 60 cycles per second) simultaneously with the pulses, preferably at a sampling rate of 80 microseconds. This slower sampling rate of the voltage waveform gives easier recognition of the fault condition and selection of appropriate blocks of high speed memory for comparison, allowing the position of the fault to be accurately determined.

The time interval between the pulses is typically 1 millisecond. If the time interval is too long, the fault may be missed; if the time interval is too short, the signal becomes very complex.

Preferably, the predetermined time allows eight pulses to be injected after a fault condition is detected, and preferably the memory records sixteen consecutive pulses at any one time. In this case, when a fault is detected, the memory contains recordings of eight pulses before the fault is detected and eight after.

Examples of two different conditions of a cable for which pulse-echo or impulse-current waveforms can be obtained, digitised and stored include (a) before the fault appears and after the fault appears and (b) before the fault is conditioned (e.g. by fault burning or reenergisation) and after the fault is conditioned.

The improved apparatus in accordance with the invention preferably includes a triggering circuit which is responsive to the level of current flowing in the cable.

The invention also includes a method of detecting and locating a fault in an electric cable or cable installation using the improved apparatus herein defined.

The invention is now described, by way of example, with reference to the accompanying drawings, in which.

Figure 1:
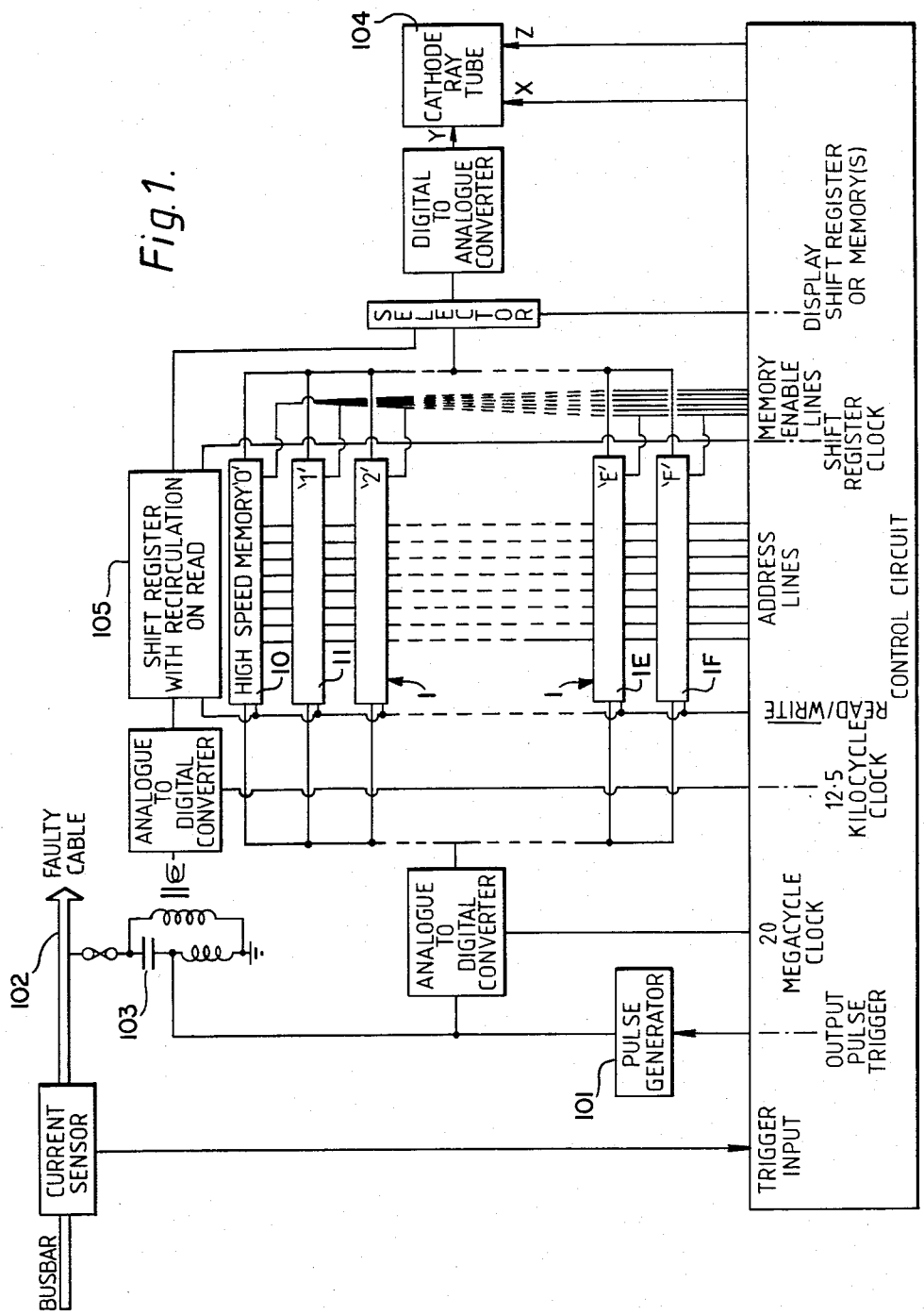
FIG. 1 is a diagram of typical apparatus.
Figure 2:
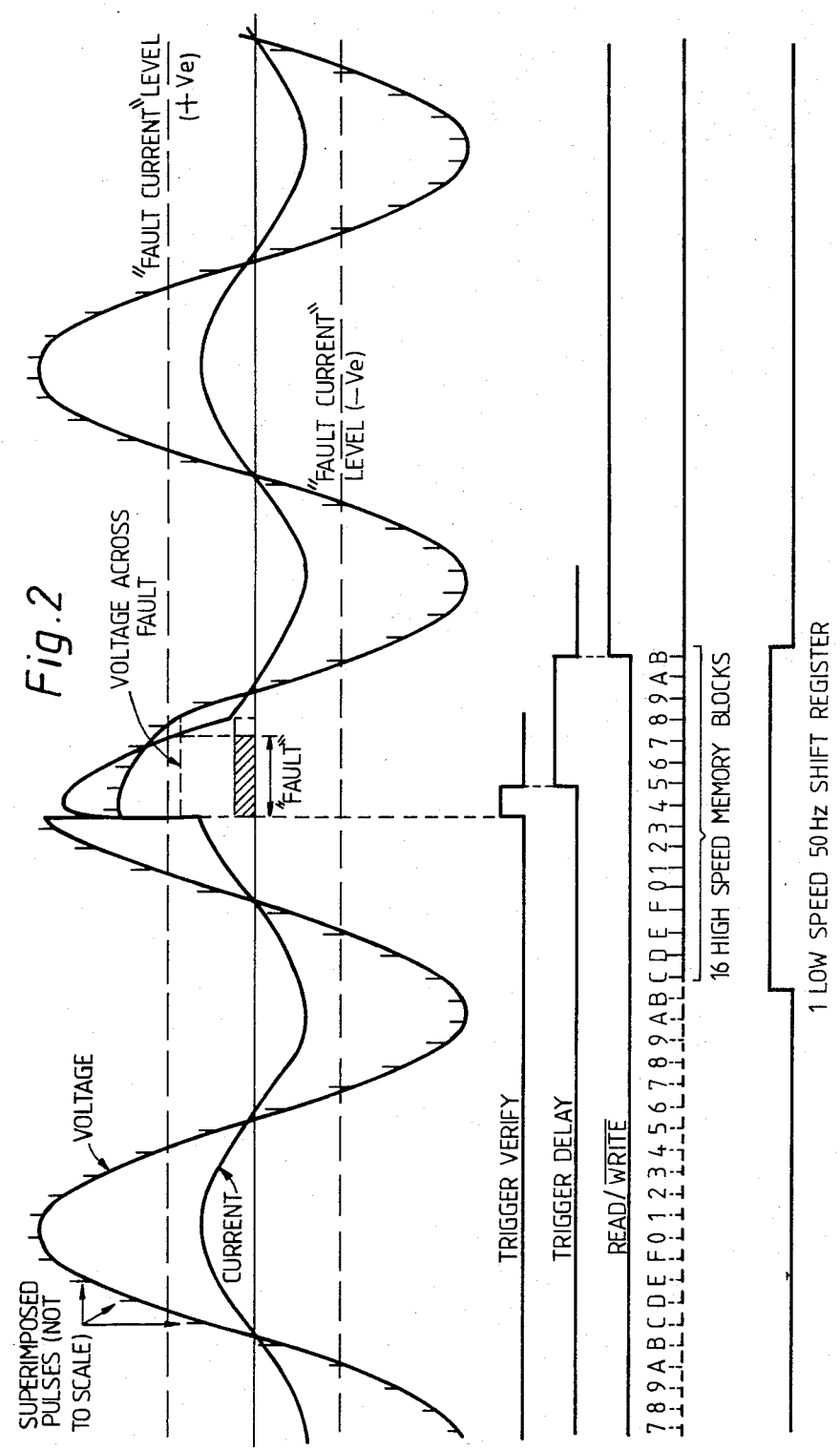
FIG. 2 is a trace of various waveforms in the diagram of FIG. 1.
Figure 3:
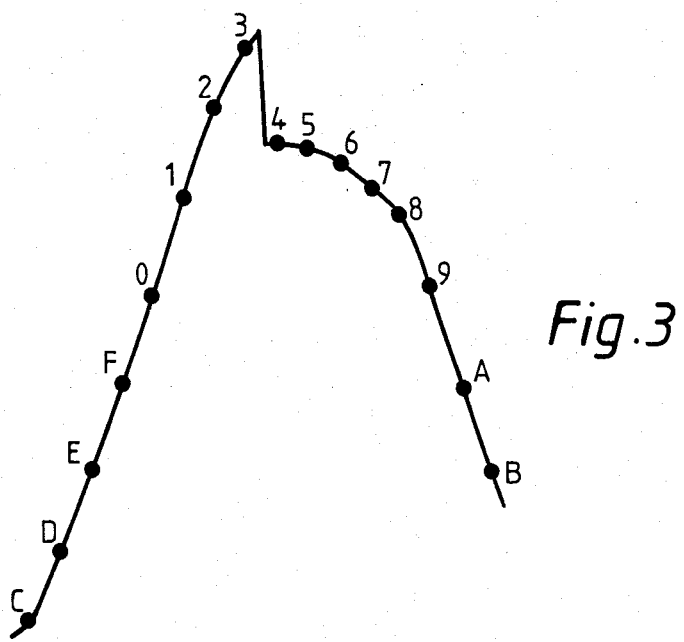
FIG. 3 is the voltage waveform when the fault condition is detected.
Figure 4:
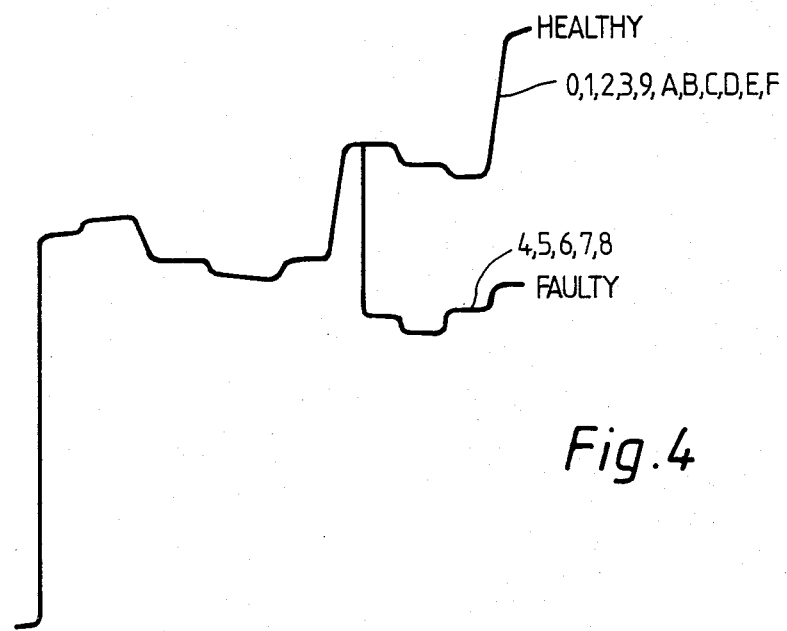
FIG. 4 illustrates the difference between a pule-echo recording when the cable is live and healthy, and when the cable is live and faulty.

In the typical arrangement shown in FIG. 1 the 16×256 word (6 or 8 bit) high speed memories 1 are clocked at 20 MHz. The memories 1 are organised as 256 byte blocks 10, 11 which are enabled sequentially every 1 mS for 12.8 microseconds, 0.5 microseconds after enabling each block 10, 11 the low voltage pulse generator 101 injects a signal (FIGS. 2 and 3) into the cable 102 under test via the blocking capacitor 103. The resulting pulse echo or impulse current waveform (FIG. 4) is stored in the enabled memory. The process is repeated every 1 mS, the memories 1 being sequentially enabled.

If the current (FIG. 2) exceeds the preset level (a fault condition) for at least 0.5 mS (to preclude spurious triggering from noise, etc., which usually lasts less than 0.5 mS), the control circuit allows 8 more pulses to be transmitted before switching the memories 1 over to "read".

In the "read" mode any two of the high speed memories 1 can be displayed simultaneously on the cathode ray tube 104 for comparison, and a signal is applied to the Z axis of the tube to allow accurate measurement of the time interval between the injected pulse and the point of separation of the two waveforms (FIG. 4), from which measurement the position of the fault can be determined.

To provide confirmation of the fault condition at the time of triggering a shift register 105 is used to store the power frequency waveform before, during and after the fault. In the "write" mode the shift register is clocked every 80 microseconds which, if it is 256 words long, gives a total recording time of 20 mS.

In the "read" mode the shift register 105 (which includes internal re-circulation) can be displayed on the cathode ray tube 104 and the "points on wave" where the high speed memories were enabled are identified by intensifying the displayed trace during the appropriate clock pulses.

Figure 5:
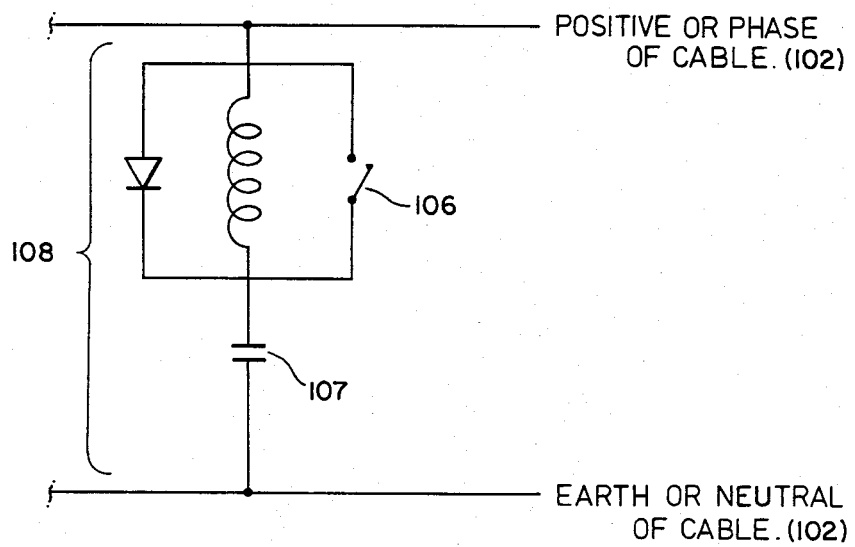
FIG. 5 is a circuit simulating a cable fault.

Results obtained on a multibranched network will often be ambiguous as several positions on a cable 102 may be equidistant from the measuring point. The problem is resolved using the artificial "fault" circuit 108 illustrated in FIG. 5 which can be connected to either energised or unenergised cables to provide a reference waveform or waveforms. With the switch 106 closed the capacitor 107 appears as a permanent short-circuit fault. With the switch 106 open the circuit 108 can be used on energised cables to exhibit a characteristic which varies during a cycle of the supply voltage. During the time from negative peak voltage to positive peak voltage the circuit 108 appears as a short-circuit to the high frequency pulses, during the remainder of the cycle the circuit presents a high impedance, that is, the short circuit disappears. With the switch 106 in the open position the circuit 108 therefore appears as an intermittent fault, simulating a fault exhibiting a non-linear and unstable voltage: current characteristic. If a fault is detected in the cable 102, and the approximate position is determined, the circuit 108 is connected to the cable 102 in the vicinity of the fault position. An accurate determination of the position of fault can be made by relating its indicated position to the known position of the artificial fault, thereby reducing any errors associated with the measurement.

What we claim as our invention is:

1. Apparatus for detecting and locating, using a pulse-echo technique, unstable and transitory faults as well as stable faults in an energised power distribution electric cable installation which apparatus comprises:
   (a) means for detecting two different conditions from the voltampere characteristics of the electric cable, one of said two different conditions being before fault appears in one of the power distribution cables of the installation and the other of said two different conditions being whilst a fault is present in one of the power distribution cables of the installation;
   (b) means for injecting a series of pulses into the energised power distribution cable installation under both different conditions of the installation to obtain pulse-echo signals;
   (c) an analogue to digital converter for digitising the pulse-echo signals obtained under said two different conditions of the installation;
   (d) memory means for storing the digitised signals and for recording a predetermined number of pulses;
   (e) means for terminating the recording of pulses a predetermined time after a fault condition is detected; and
   (f) means for comparing the waveforms of signals obtained under the two said conditions in order that the distance of the fault in said power distribution cable of the installation can be determined.

2. Apparatus as claimed in claim 1 wherein the apparatus also comprises means for recording a power frequency waveform simultaneously with the pulses.

3. Apparatus as claimed in claim 1 or 2, wherein the predetermined time allows eight pulses to be injected after a fault condition is detected, and the memory records sixteen consecution pulses at any one time.

4. Apparatus as claimed in claim 1, wherein the apparatus also comprises a triggering circuit which is responsive to the level of current flowing in the cable.

5. Apparatus as claimed in claim 1, wherein a circuit is connected to the cable or cable installation which is capable of simulating a cable fault.

6. Apparatus for detecting and locating, using an impulse-current technique, unstable and transitory faults as well as stable faults in an energised power distribution electric cable installation which apparatus comprises:
   (a) means for detecting two different conditions from the voltampere characteristics of the electric cable, one of said two different conditions being before fault appears in one of the power distribution cables of the installation and the other of said two different conditions being whilst a fault is present in one of the power distribution cables of the installation;
   (b) means for injecting a series of pulses into the energised power distribution cable installation under both different conditions of the installation to obtain impulse-current signals;
   (c) an analogue to digital convertor for digitising the signals obtained under said two different conditions of the installation;
   (d) memory means for storing the digitised signals and for recording a predetermined number of pulses;
   (e) means for terminating the recording of pulses a predetermined time after a fault condition is detected; and
   (f) means for comparing the waveforms of signals obtained under the two said conditions in order that the distance of the fault in said power distribution cable of the installation can be determined.

7. Apparatus as claimed in claim 6 wherein the apparatus also comprises means for recording a power frequency waveform simultaneously with the pulses.

8. Apparatus as claimed in claim 6 or claim 7, wherein the predetermined time allows eight pulses to be injected after a fault condition is detected, and the memory records sixteen consecutive pulses at any one time.

9. Apparatus as claimed in claim 6, wherein the apparatus also comprises a triggering circuit which is responsive to the level of current flowing in the cable.

10. Apparatus as claimed in claim 6, wherein a circuit is connected to the cable or cable installation which is capable of simulating a cable fault.

* * * * *

UNITED STATES PATENT AND TRADEMARK OFFICE
CERTIFICATE OF CORRECTION

PATENT NO. : 4,491,782

DATED : January 1, 1985

INVENTOR(S) : EDWARD J. BELLIS; PHILIP F. GALE

It is certified that error appears in the above-identified patent and that said Letters Patent is hereby corrected as shown below:

Column 2, line 46, change "pule-echo" to --pulse-echo--.

Signed and Sealed this

Sixth Day of August 1985

[SEAL]

Attest:

DONALD J. QUIGG

Attesting Officer

Acting Commissioner of Patents and Trademarks